United States Patent
Song et al.

(10) Patent No.: US 8,937,370 B2
(45) Date of Patent: Jan. 20, 2015

(54) MEMORY DEVICE AND FABRICATING METHOD THEREOF

(75) Inventors: In-Sang Song, Seoul (KR); Sang-Sub Song, Suwon-si (KR)

(73) Assignee: Samsung Electronics Co., Ltd., Yeongtong-gu, Suwon-si, Gyeonggi-do (KR)

(\*) Notice: Subject to any disclaimer, the term of this patent is extended or adjusted under 35 U.S.C. 154(b) by 247 days.

(21) Appl. No.: 13/430,160

(22) Filed: Mar. 26, 2012

(65) Prior Publication Data

US 2012/0300412 A1    Nov. 29, 2012

(30) Foreign Application Priority Data

May 25, 2011  (KR) .................. 10-2011-0049751

(51) Int. Cl.
*H01L 23/552* (2006.01)
*H01L 23/00* (2006.01)
(Continued)

(52) U.S. Cl.
CPC .............. *H01L 23/552* (2013.01); *H01L 24/97* (2013.01); *H01L 25/0657* (2013.01); *H01L 23/49822* (2013.01); *H01L 23/3128* (2013.01); *H01L 21/561* (2013.01); *H01L 21/568* (2013.01); *H01L 24/13* (2013.01); *H01L 24/16* (2013.01); *H01L 24/48* (2013.01); *H01L 24/73* (2013.01); *H01L 2224/13009* (2013.01); *H01L 2224/16146* (2013.01); *H01L 2224/16225* (2013.01); *H01L 2224/16227* (2013.01); *H01L 2224/32145* (2013.01); *H01L 2224/32225* (2013.01); *H01L 2224/48227* (2013.01); *H01L 2224/73265* (2013.01); *H01L 2224/97* (2013.01); *H01L 2225/0651* (2013.01); *H01L 2225/06517* (2013.01); *H01L 2924/01006* (2013.01); *H01L 2924/014* (2013.01); *H01L 2924/1431* (2013.01); *H01L 2924/1434* (2013.01); *H01L 2924/1435* (2013.01); *H01L 2924/15311* (2013.01); *H01L 2924/15312* (2013.01); *H01L 2225/06513* (2013.01); *H01L 2225/06541* (2013.01); *H01L 2225/06565* (2013.01); *H01L 2225/06568* (2013.01); *H01L 2924/01029* (2013.01); *H01L 2224/16145* (2013.01); *H01L 2924/3025* (2013.01)
USPC .......................................... 257/659; 257/660

(58) Field of Classification Search
USPC .................................................. 257/659, 660
See application file for complete search history.

(56) References Cited

U.S. PATENT DOCUMENTS

2003/0098469 A1    5/2003   Spielberger et al.
2004/0145044 A1    7/2004   Sugaya et al.
(Continued)

FOREIGN PATENT DOCUMENTS

JP    2009-016715    1/2009
KR    10-0645755     5/2002
KR    2008-071457    8/2008

*Primary Examiner* — Timor Karimy
(74) *Attorney, Agent, or Firm* — Muir Patent Consulting, PLLC (57) ABSTRACT

The present disclosure provides a memory device and a fabricating method thereof. The memory device includes a substrate including a first metal layer formed therein, the first metal layer having at least a first surface with at least a first exposed portion of the first surface exposed at a lateral surface of the substrate, at least a first semiconductor chip formed on a top surface of the substrate, and a second metal layer surrounding the first semiconductor chip and extending to lateral surfaces of the substrate, at least a first portion of the second metal layer contacting the exposed surface of the first metal layer.

15 Claims, 10 Drawing Sheets

(51) Int. Cl.
   *H01L 25/065*   (2006.01)
   *H01L 23/498*   (2006.01)
   *H01L 23/31*    (2006.01)
   *H01L 21/56*    (2006.01)

(56) References Cited

U.S. PATENT DOCUMENTS

2004/0238948 A1    12/2004  Shiozawa et al.
2006/0220210 A1    10/2006  Karnezos et al.
2006/0220224 A1    10/2006  Cheng
2006/0266547 A1 *  11/2006  Koga ........................... 174/255
2008/0017968 A1     1/2008  Choi et al.
2009/0152738 A1     6/2009  Sathe et al.
2009/0309204 A1    12/2009  Ha
2010/0072597 A1     3/2010  Chow et al.
2011/0140247 A1     6/2011  Pagaila et al.
2011/0227209 A1     9/2011  Yoon et al.
2012/0061854 A1     3/2012  Chow et al.

* cited by examiner

MEMORY DEVICE AND FABRICATING METHOD THEREOF

CROSS-REFERENCE TO RELATED APPLICATION

This application claims priority under 35 U.S.C. 119 from Korean Patent Application No. 10-2011-0049751 filed on May 25, 2011 in the Korean Intellectual Property Office, the entire contents of which are herein incorporated by reference.

BACKGROUND

The present disclosure relates to a memory device and a fabricating method thereof.

With miniaturization of electronic devices and an increase in the data speed of those devices, the occurrence of electromagnetic interference (EMI) is becoming problematic.

SUMMARY

The present disclosure provides a memory device that is suitable for miniaturization of an electronic device.

The present disclosure also provides a fabricating method of a memory device that is suitable for miniaturization of an electronic device.

According to one embodiment, there is provided a memory device including a substrate including a ground layer formed therein, the ground layer having an exposed surface exposed at a lateral surface of the substrate, a semiconductor chip formed on one surface of the substrate, a molding member formed on one surface of the substrate and molding the semiconductor chip, and a shielding layer surrounding the molding member and extending to lateral surfaces of the substrate while contacting the exposed surface of the ground layer.

According to another embodiment, there is provided a semiconductor device including a substrate including a first metal layer formed therein, the first metal layer having an exposed surface exposed at a lateral surface of the substrate, a semiconductor chip formed on one surface of the substrate, and a second metal member formed on at least a portion of the lateral surface of the substrate and contacting the exposed surface of the first metal layer.

In one embodiment, a semiconductor device includes a package substrate; a first semiconductor chip formed on a top surface of the package substrate; and an electromagnetic interference (EMI) shield, the EMI shield having a bottom layer formed in the package substrate and lateral and top layers extending to surround the lateral and top surfaces of the first semiconductor chip, wherein at least a first portion of the bottom layer is exposed at a lateral surface of the package substrate, and the first exposed portion of the bottom layer of the EMI shield is connected to the lateral layers of the EMI shield, the package substrate further including a first interconnection formed on a top surface of the bottom layer and spaced apart from the EMI shield, and a second interconnection formed on a bottom surface of the bottom layer and spaced apart from the EMI shield, wherein the first interconnection and the second interconnection are not exposed at a lateral surface of the package substrate.

BRIEF DESCRIPTION OF THE DRAWINGS

Exemplary embodiments will be more clearly understood from the following detailed description taken in conjunction with the accompanying drawings in which.

DETAILED DESCRIPTION OF THE EMBODIMENTS

The present disclosure will now be described with reference to the accompanying drawings, in which various embodiments are shown. The invention may, however, be embodied in many different forms and should not be construed as being limited to the embodiments set forth herein. In the drawings, the thickness and relative thickness, and size and relative size of layers and regions may be exaggerated for clarity.

It will be understood that when an element or layer is referred to as being "on," "connected to," or "coupled to" another element or layer, it can be directly on, connected to or coupled to another element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items and may be abbreviated as "/".

It will be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section, and, similarly, a second element, a second component or a second section could be termed a first element, a first component or a first section without departing from the teachings of the disclosure.

The terminology used herein is for the purpose of describing particular embodiments only and is not intended to be limiting of the invention. As used herein, the singular forms "a", "an" and "the" are not intended to exclude the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures have schematic properties, and shapes of regions shown in figures exemplify specific shapes of regions of elements, and the specific properties and shapes do not limit aspects of the invention.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, a semiconductor device according to a first embodiment will be described with reference to FIGS. 1 to 5. After a semiconductor device (e.g., a semiconductor package) is mounted on a circuit board, an EMI shield surrounding the semiconductor device may be installed on the circuit board. Due to the height and width of the EMI shield, it may be difficult to achieve miniaturization of the electronic device that includes the semiconductor device. The EMI shield may be connected to a predetermined voltage signal. In one embodiment, the circuit board may include interconnections for applying the predetermined voltage signal to the EMI shield.

Figure 1:
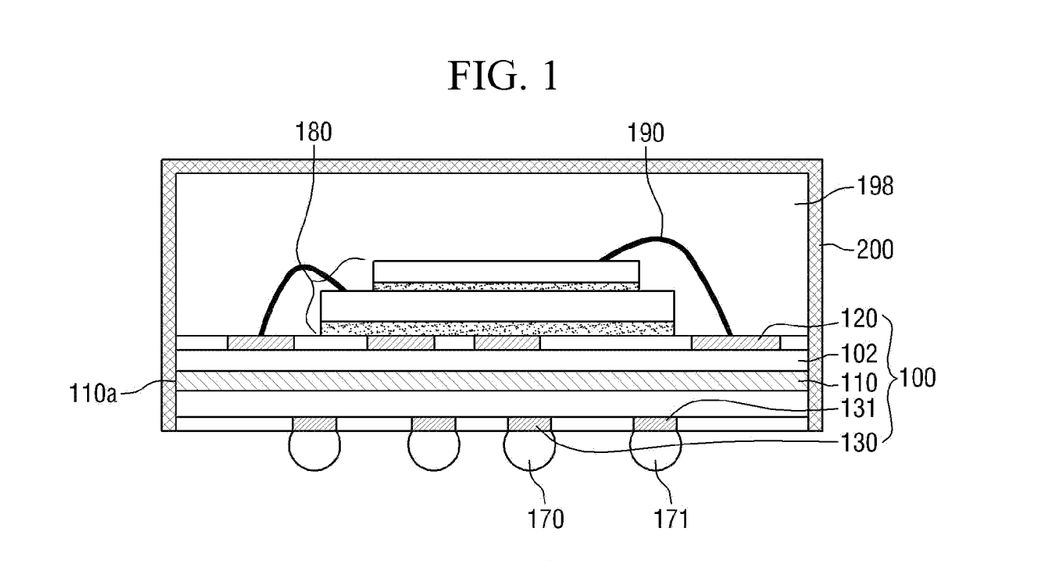
FIG. 1 is a cross-sectional view of a semiconductor device according to a first embodiment.
Figure 2:
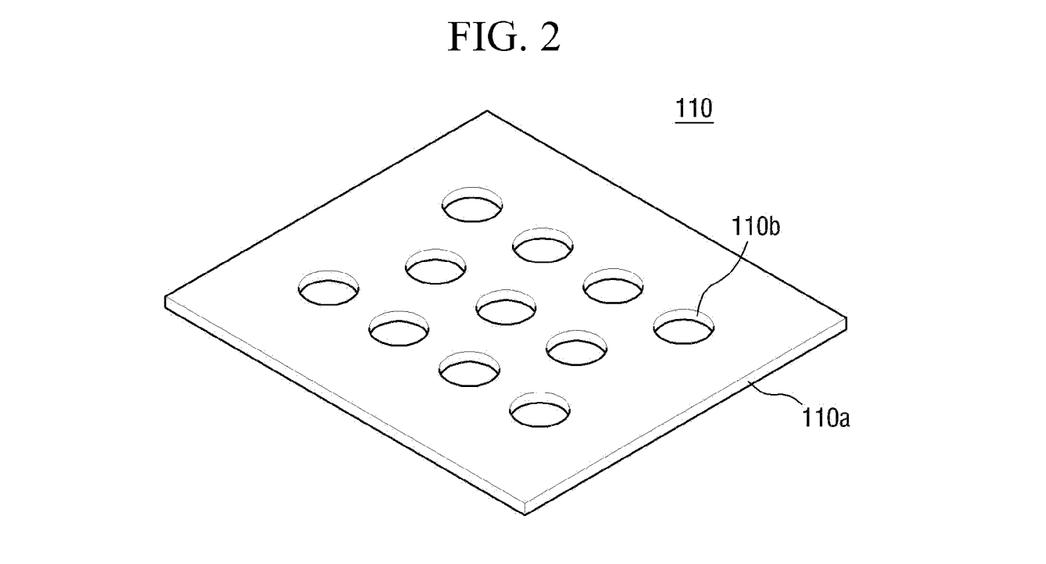
FIG. 2 is a perspective view of an exemplary first metal layer shown in FIG. 1.
Figure 3:
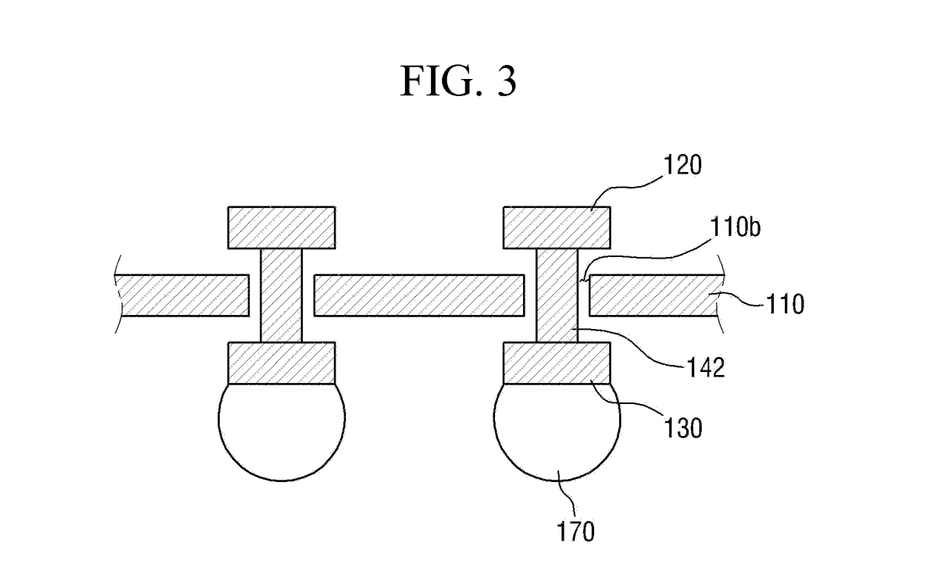
FIG. 3 is a cross-sectional view illustrating an exemplary relationship between first and second interconnections and the first metal layer shown in FIG. 1.
Figure 4:
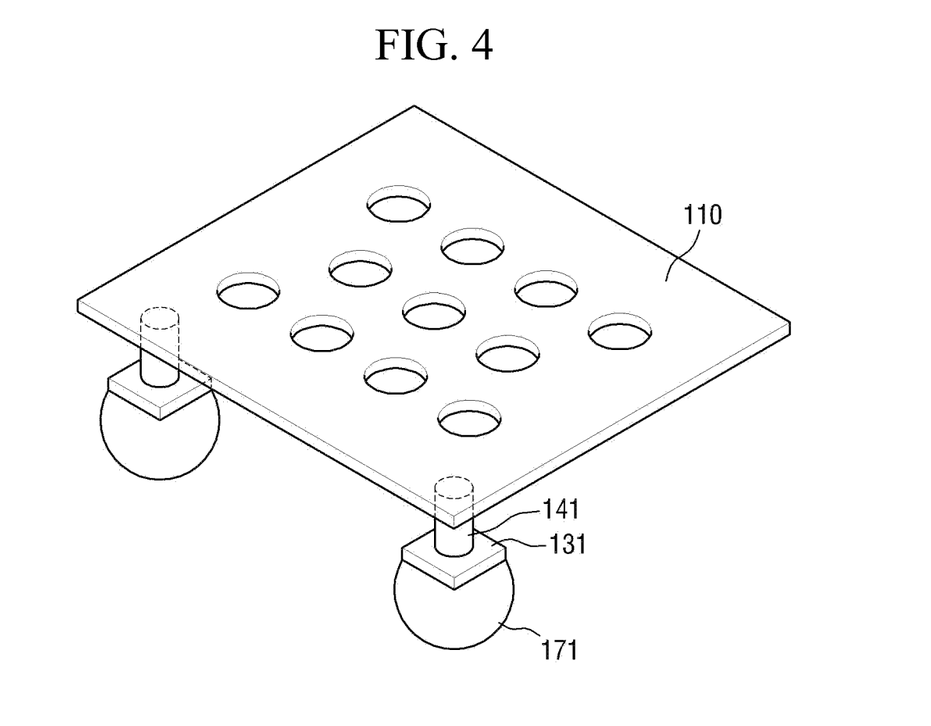
FIG. 4 is a perspective view illustrating an exemplary connection mechanism of the first metal layer shown in FIG. 1.
Figure 5:
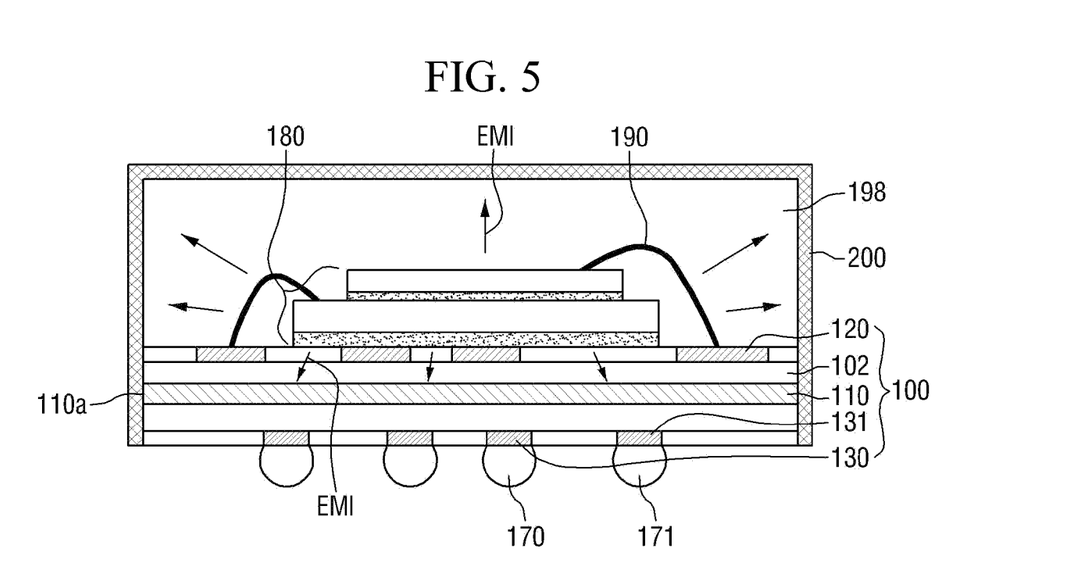
FIG. 5 illustrates an EMI shielding operation of a semiconductor device according to the first embodiment.

FIG. 1 is a cross-sectional view of a semiconductor device according to a first embodiment. FIG. 2 is a perspective view of a first metal layer shown in FIG. 1. FIG. 3 is a cross-sectional view illustrating an exemplary relationship between the first and second interconnections and the first metal layer shown in FIG. 1. FIG. 4 is a perspective view illustrating an exemplary connection mechanism of the first metal layer shown in FIG. 1. FIG. 5 illustrates an exemplary EMI shielding operation of a semiconductor device according to the first embodiment.

First, referring to FIGS. 1 and 2, the semiconductor device 1 according to the first embodiment includes a substrate 100 having a first metal layer 110, a set of semiconductor chips 180, a molding member 198, external connection terminals 170 and 171, and a second metal layer 200.

The set of semiconductor chips 180 is formed on one surface of the substrate 100. The set of semiconductor chips 180 may be formed of silicon, a silicon on insulator (SOI), silicon germanium, or the like. However, the type of material from which the set of semiconductor chips 180 is formed is not limited to the examples described herein. Although not shown in detail, the set of semiconductor chips 180 may have, integrated therein, at least multi-layered interconnections, a plurality of transistors, and/or a plurality of passive elements. The set of semiconductor chips 180 may include one or more semiconductor chips, and may include one or more stacked semiconductor chips. For example, FIG. 1 shows a set of semiconductor chips 180 that include two stacked semiconductor chips that are connected to the substrate 100 through wire bonding 190. Other types of connections (e.g. through via electrodes) may be used as well. The number of stacked semiconductor chips in the set of semiconductor chips 180, and the ways in which the semiconductor chips and the substrate 100 are connected, are not limited to the examples described herein.

In one embodiment, a molding member 198 is formed at one surface of the substrate 100 to mold the set of semiconductor chips 180. The molding member 198 may be made of, for example, an epoxy molding compound (EMC) or an under-fill material. The molding member 198 may be an insulator. The material of the molding member 198 is not limited to the examples described herein. As shown, a lateral surface of the molding member 198 and a lateral surface of the substrate 100 may be coplanar.

In one embodiment, external connection terminals 170 and 171 may be formed at another surface of the substrate 100. For example, the external connection terminals 170 and 171 may be formed at a surface of the substrate 100 opposite to the surface on which the molding member 198 is formed. In the illustrated embodiment, the external connection terminals 170 and 171 are solder balls, but the type of external connection terminal is not limited to the examples described herein. For example, the external connection terminals 170 and 171 may be conductive bumps, conductive spacers, pin grid arrays (PGAs), or the like, electrically connected to circuitry of the one or more semiconductor chips and for communicating signals and/or power between the one or more semiconductor chips and an external device (e.g. an external host or controller).

The substrate 100 may include a first metal layer 110, a first interconnection 120, second interconnections 130 and 131, an insulation layer 102, and vias 141 and 142.

The first metal layer 110 may be composed of one or more conductive materials, such as Cu, Al, Cu/Ni, or Ag. In one embodiment, the first metal layer 110 may be composed of a polyimide. The type of material in the first metal layer 110 is not limited to the examples herein and can include other conductive materials capable of shielding EMI.

In one embodiment, the first interconnection 120 is disposed on one surface (e.g., a top surface) of the substrate 100, to be spaced apart from the first metal layer 110. As shown, an insulation layer 102 may be formed between the first interconnection 120 and the first metal layer 110. The insulation layer 102 may cover surfaces of the first interconnection 120. For example, the insulation layer 102 may cover surfaces of the first interconnection 120 such as to fill the space between the first interconnection 120 and the first metal layer 110. The second interconnection 130 is disposed on the other surface (e.g., a bottom surface) of the substrate 100 to be spaced apart from the first metal layer 110. As shown, an insulation layer 102 may be formed between the second interconnection 130 and the first metal layer 110. The insulation layer 102 may cover surfaces of the second interconnection 130. For example, the insulation layer 102 may cover surfaces of the second interconnection 130 such as to fill the space between the first metal layer 110 and the second interconnection 130. The insulation layer 102 may also cover and surround sidewalls of the via 142 to fill in the space between the via 142 and metal layer 110. The first interconnection 120 and the second interconnection 130 may not be exposed at the lateral surfaces of the substrate 100.

Referring to FIGS. 2 and 3, in one embodiment, the first metal layer 110 is formed in a plate-like shape to extend laterally through the entire substrate 100 between other layers of the substrate 100. The first metal layer 110 may be formed to have one or more holes 110b. The first metal layer may alternatively be formed to have a larger window, one or more circular holes, one or more square shaped holes, and so forth. The shape of the first metal layer 110 is not limited to the examples described herein. The shape of the holes 110b are not limited to the examples described herein.

The via 142 electrically connects the first interconnection 120 and the second interconnection 130 and may penetrate the hole 110b. Driving signals (e.g., a command signal, a data signal, etc.) are transmitted to the semiconductor chip 180 through the external connection terminal 170, the second interconnection 130, the via 142, and the first interconnection 120. Each of the external connection terminal 170, the second interconnection 130, the via 142, and the first interconnection 120 may be formed of a conductive material (e.g., a metal or a polyimide). The first interconnection 120 may be a pad for electrically connecting to circuitry in the set of semiconductor chips 180. The second interconnection 130 may be a pad for electrically connecting to external circuitry outside the set of semiconductor chips 180.

Referring back to FIG. 1, the first metal layer 110 is formed within the substrate 100 and includes an exposed surface 110a, which is exposed at lateral surfaces of the substrate 100.

In one embodiment, at least a portion of the first metal layer 110 overlaps with the semiconductor chip 180. For example, when viewed from one surface (e.g., a top surface) of the semiconductor chip 180, at least a part of one of the first metal layer 110 and the semiconductor chip 180 may look to be covering at least a part of the other of the first metal layer 110 and the semiconductor chip 180. Referring to FIG. 4, the first metal layer 110 may be electrically connected to the external connection terminal 171, and a predetermined voltage signal may be applied to the external connection terminal 171. For example, a ground voltage may be applied to the external connection terminal 171. In one embodiment, the predetermined voltage signal is transmitted to the first metal layer 110 through the external connection terminal 171, the second interconnection 131, and the via 141. In an embodiment where the voltage signal is a ground voltage, the first metal layer 110 becomes a ground layer. The type of voltage of the predetermined voltage signal may be a ground voltage but is not limited to the examples described herein.

Referring back to FIG. 1, the second metal layer 200 may completely cover the top and lateral surfaces of the molding member 198 (or the set of semiconductor chips 180) and may extend to the lateral surfaces of the substrate 100, so that the second metal layer 200 may contact the exposed surface 110a of the first metal layer 110. In one embodiment, unlike in FIG. 1, the second metal layer 200 may have various shapes that do not completely surround the top and lateral surfaces of the set of semiconductor chips 180 and/or the molding member 198. The shape of the second metal layer 200 is not limited to the examples described herein.

In one embodiment, the first interconnection 120 and the second interconnection 130 are not exposed at the lateral surfaces of the substrate 100, while portions of the first metal layer 110 are exposed at the lateral surfaces of the substrate 100. In this embodiment, the second metal layer 200 is not brought into contact with the first interconnection 120 and the second interconnection 130 but is brought into contact with the first metal layer 110. In this embodiment, the second metal layer 200 and the first metal layer 110 have the same potential. In an embodiment where a ground voltage is applied to the first metal layer 110, for example, through a single terminal, a ground voltage may be applied to both of the first metal layer 110 and the second metal layer 200.

Referring to FIG. 5, EMI generated from the set of semiconductor chips 180 may be shielded by the first metal layer 110 and the second metal layer 200. For example, the EMIs emitted upwardly and laterally from the set of semiconductor chips 180 are shielded by the second metal layer 200 and the EMI emitted downwardly from the set of semiconductor chips 180 is shielded by the first metal layer 110. The first metal layer 110 and the second metal layer 200 may serve as an EMI shield and may completely surround the molding member 198 and the set of semiconductor chips 180, for example both above and below, and on lateral sides. In the semiconductor device according to the first embodiment, the EMIs emitted upwardly, laterally and downwardly can be shielded in a package level. The use of the semiconductor device according to the first embodiment may facilitate miniaturization of an electronic device.

In one embodiment, as described above, the second metal layer 200 and the exposed surface 110a of the first metal layer 110 contact each other. In this embodiment, a voltage signal is applied to the second metal layer 200. It may not be necessary to provide a separate interconnection for applying a voltage signal to the second metal layer 200. The second metal layer 200 may be formed of, for example, Cu/Ni, Cu or Ag, but is not limited to the examples described herein and can include other conductive materials capable of shielding EMI.

While FIG. 1 shows that the substrate 100 is a 3-layer substrate including the first metal layer 110, the first interconnection 120 and the second interconnection 130. However, the structure of the substrate 100 is not limited to the examples. For example, the substrate 100 may be four or more layers.

Figure 6:
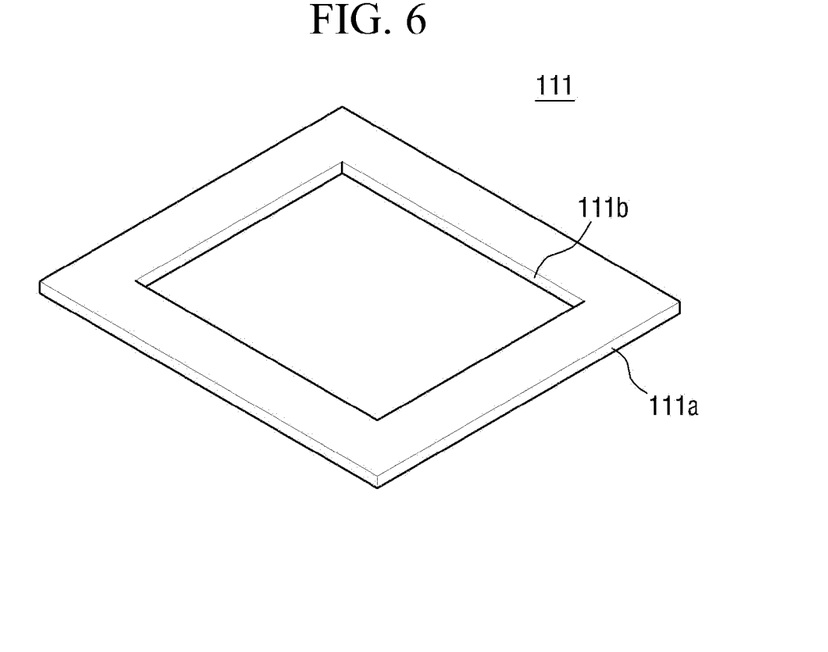
FIG. 6 is a perspective view of a semiconductor device according to a second embodiment.

FIG. 6 is a perspective view of a semiconductor device according to a second embodiment. FIG. 6 illustrates only a first metal layer of the exemplary semiconductor device. Components that are not illustrated in FIG. 6 are substantially the same as those of the semiconductor device 1 according to the first embodiment.

Referring to FIG. 6, a first metal layer 111 may be formed along lateral surfaces within the substrate 100. In some embodiments, the first metal layer 111 may have a window 111b formed in the layer. In one embodiment, the first interconnection 120 formed on one surface of the first metal layer 111 and the second interconnection 130 formed on the other surface of the first metal layer 111 are electrically connected with each other through a plurality of vias penetrating the window 111b, but are not electrically connected to the first metal layer 111. Additional interconnections, such as interconnection 131 shown in FIG. 4, may electrically connect to the first metal layer 111 to permit a ground voltage or other voltage to be applied to the first metal layer 111 and the second metal layer 200. The vias may be through substrate vias. In one example, the vias are through-silicon vias. In one embodiment, the exposed surface 111a of the first metal layer 111 and the second metal layer 200 contact each other.

Figure 7:
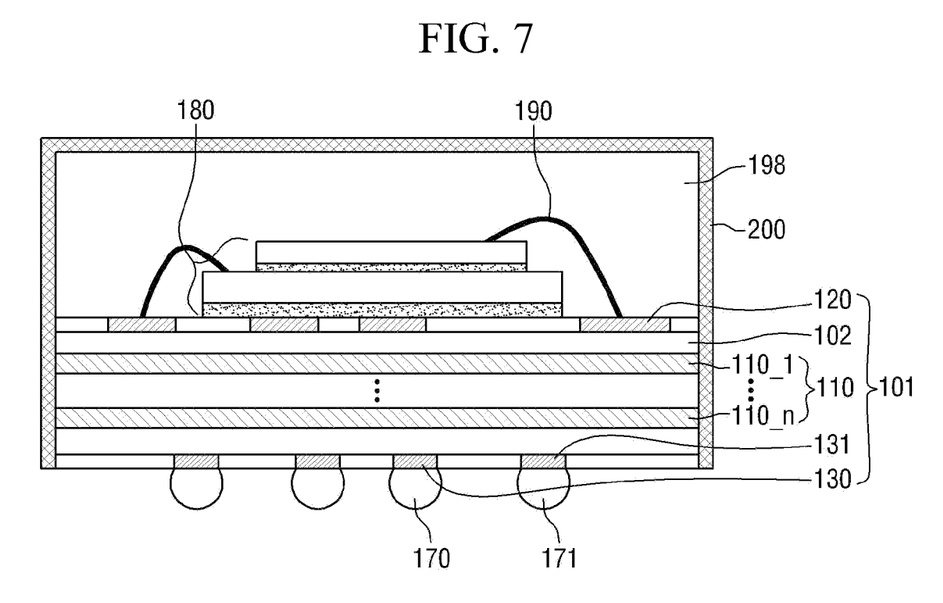
FIG. 7 is a cross-sectional view of a semiconductor device according to a third embodiment.

FIG. 7 is a cross-sectional view of a semiconductor device according to a third embodiment. The following description will focus on substantially different components from those of the semiconductor device according to the first embodiment.

Referring to FIG. 7, the first metal layer 110 may include first to n-th stacked sub-metal layers 110_1~110_n (n is a natural number of 2 or greater), which are spaced apart from each other. The first to n-th sub-metal layers 110_1~110_*n* include first to n-th sub-exposed surfaces exposed at lateral surfaces of a substrate 101.

The first to n-th sub-metal layers 110_1~110_*n* may receive a voltage signal. In one embodiment, the first to n-th sub-metal layers 110_1~110_*n* may receive a ground voltage. In this embodiment, the second metal layer 200 contacts at least one of the first to n-th sub-exposed surfaces, and a ground voltage may be applied to the second metal layer 200. The type of voltage the first to n-th sub-metal layers 110_1~110_*n* receive is not limited to the examples described herein.

While FIG. 7 shows that the second metal layer 200 contacts all of the first to n-th sub-exposed surfaces. In one example, the second metal layer 200 may contact one or more of the first to n-th sub-exposed surfaces or may contact half or a third of the first to n-th sub-exposed surfaces. The contact between the second metal layer 200 and the first to n-th exposed surfaces is not limited to the examples described or depicted herein.

Figure 8:
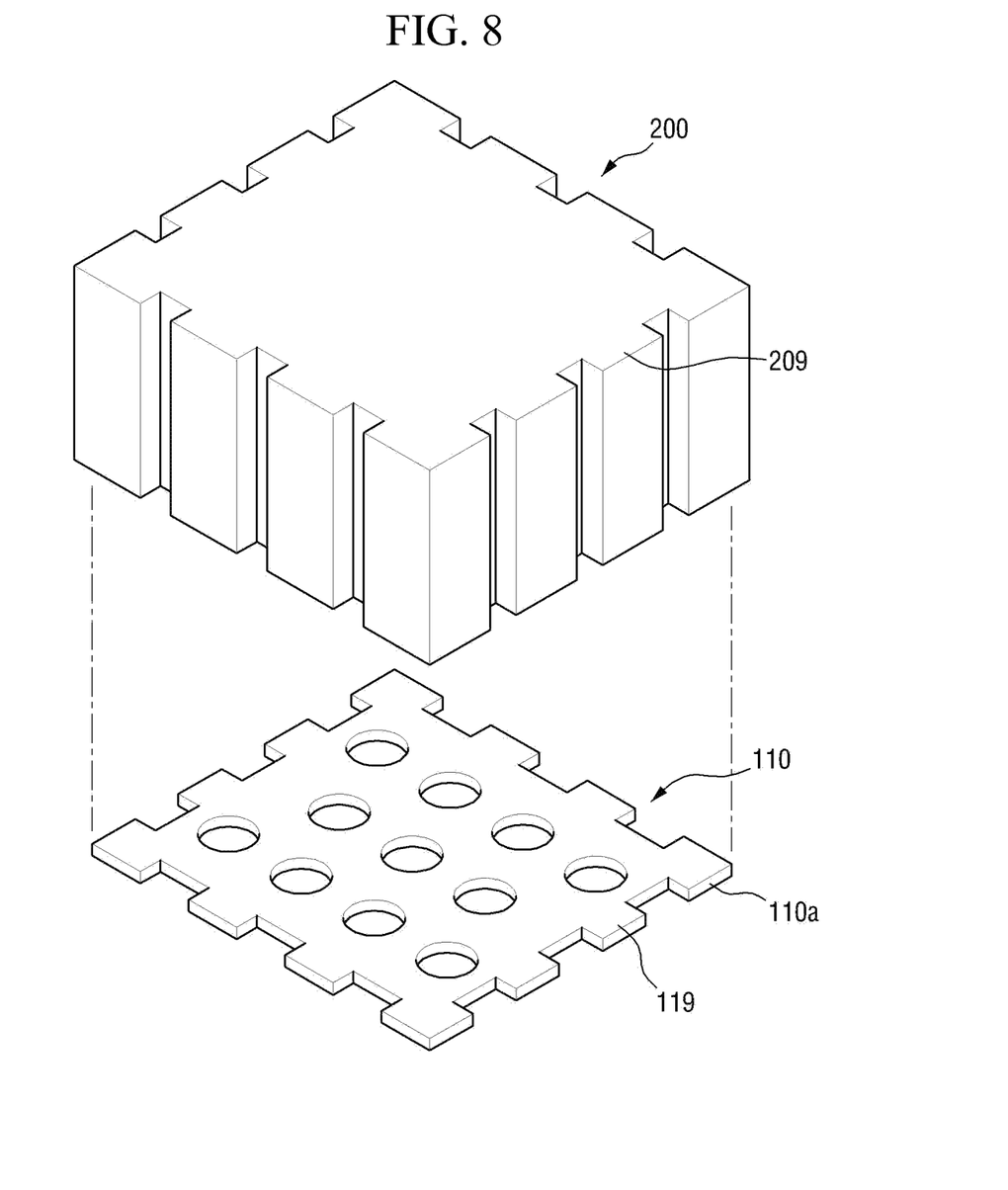
FIG. 8 is an exploded perspective view of a semiconductor device according to a fourth embodiment.

Although not separately shown, each of the first to n-th sub-metal layers 110_1~110_*n* may have holes, such as shown in FIG. 2, or a window, such as shown in FIG. 5. As shown in FIG. 8, each of the first to n-th sub-metal layers 110_1~110_*n* may have protrusions and recesses at the lateral surfaces. In one embodiment, certain of the first to n-th sub-metal layers 110_1~110_*n* have holes, while others have a window, while others may have protrusions and recesses.

FIG. 8 is an exploded perspective view of a semiconductor device according to a fourth embodiment. FIG. 8 illustrates only a first metal layer and a second metal layer. Components that are not illustrated in FIG. 8 are substantially the same as those of the semiconductor device 1 according to the first embodiment.

Referring to FIG. 8, an exposed surface 110*a* of the first metal layer 110 may include a plurality of protrusions 119 (and recesses), and a lateral surface of the second metal layer 200 may include a plurality of protrusions 209 (and recesses). As shown in FIG. 8, the protrusions 119 of the first metal layer 110 and the protrusions 209 of the second metal layer 200 may be disposed at corresponding locations.

As described above, the second metal layer 200 may contact the exposed surface 110*a* of the first metal layer 110. The first metal layer 110 and the second metal layer 200 may include the protrusions 119 and 209, respectively. A contact area between the first metal layer 110 and the second metal layer 200 may therefore be increased. As a result, the first metal layer 110 and the second metal layer 200 come into contact with each other in a more secured manner.

In one embodiment, only the exposed surface 110 of the first metal layer 110 may include a plurality of protrusions 119 (and recesses), while the second metal layer 200 may not include a plurality of protrusions 209. Conversely, in another embodiment, the second metal layer 200 may include a plurality of protrusions 209 (and recesses), while the first metal layer 110 may not include a plurality of protrusions 119. In yet another embodiment, the first metal layer 110 includes protrusions 119 (and recesses) and the second metal layer 200 includes protrusions 209 (and recesses), but not all of the protrusions 119 of the first metal layer 110 contact a protrusion 209 of the second metal 209. Similarly, in one example, not all of the protrusions 209 of the second metal layer 200 contact protrusions 119 of the first metal layer 110. The number of protrusions 119 of the first metal layer 110 may differ from the number of protrusions 209 of the second metal layer 200.

Figure 9:
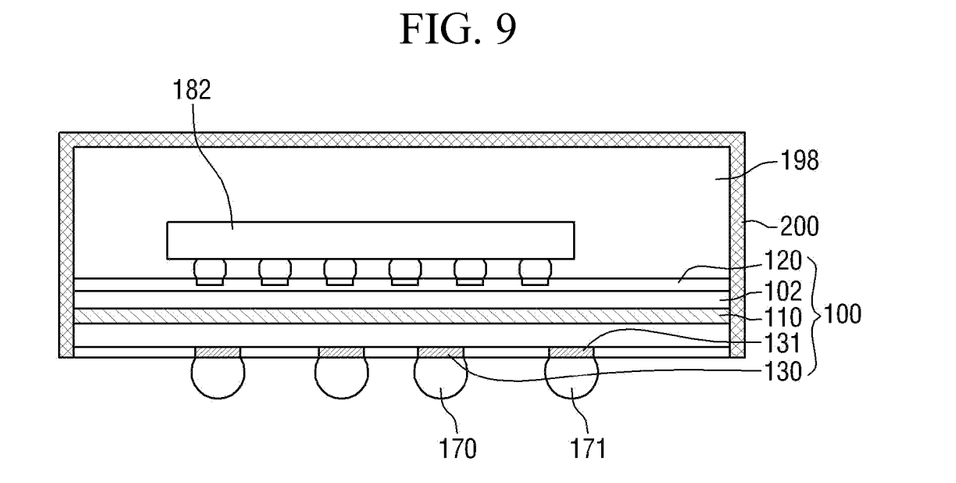
FIG. 9 is a cross-sectional view of a semiconductor device according to a fifth embodiment.
Figure 10:
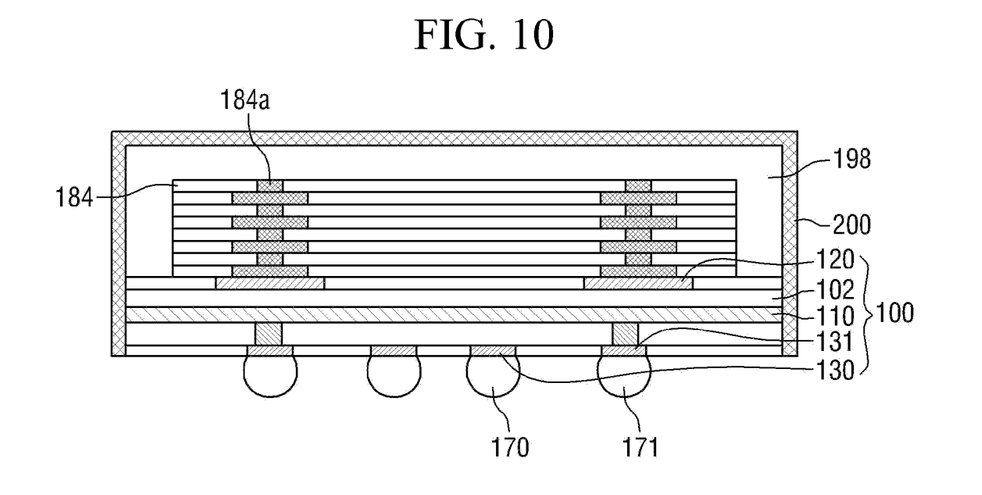
FIG. 10 is a cross-sectional view of a semiconductor device according to a sixth embodiment.

FIGS. 9 and 10 are cross-sectional views of semiconductor devices according to fifth and sixth embodiments.

Referring first to FIG. 9, in the semiconductor device according to the fifth embodiment, a semiconductor chip 182 may be shaped and oriented as a flip chip.

Referring to FIG. 10, the semiconductor device according to the sixth embodiment may include a plurality of stacked semiconductor chips 184, and each of the semiconductor chips in the semiconductor chip stack 184 may include a penetration electrode 184*a*. The penetration electrode 184*a* may be a through substrate via. In one example, the penetration electrode 184*a* may be a through silicon via. As shown, the penetration electrode 184*a* may be formed to penetrate the semiconductor chips in the semiconductor chip stack 184 from one surface to the other surface of each of the semiconductor chips. The penetration electrode 184*a* may electrically connect an active surface of one (or more) of the semiconductor chips in the semiconductor chip stack 184 to an external device, such as a controller or external host, or to another semiconductor chip.

FIGS. 11 to 14 illustrate intermediate steps in an exemplary fabricating method of a semiconductor device according to one embodiment.

Figure 11:
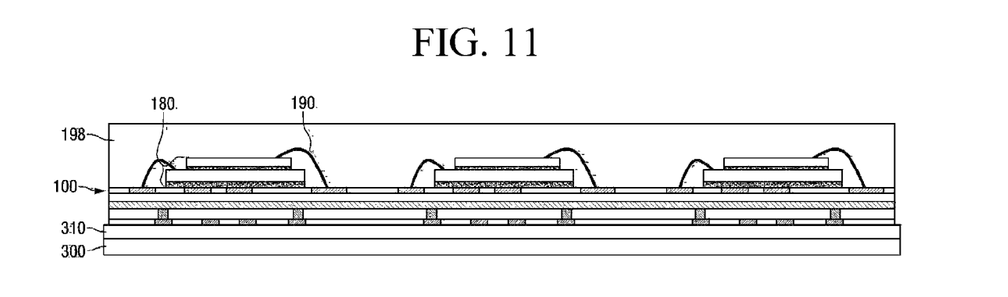
FIGS. 11 to 14 illustrate intermediate steps in an exemplary fabricating method of a semiconductor device according to the first embodiment.

Referring to FIG. 11, a substrate 100 includes a first metal layer 110, a set of semiconductor chips 180, and a molding member 198. The molding member 198 may mold the set of semiconductor chips 180 are formed on the substrate 100 and/or serve as an encapsulant for the set of semiconductor chips 180. An adhesive layer 310 may be interposed between the substrate 100 and a carrier 300 to adhere the substrate 100 to the carrier 300.

Figure 12:
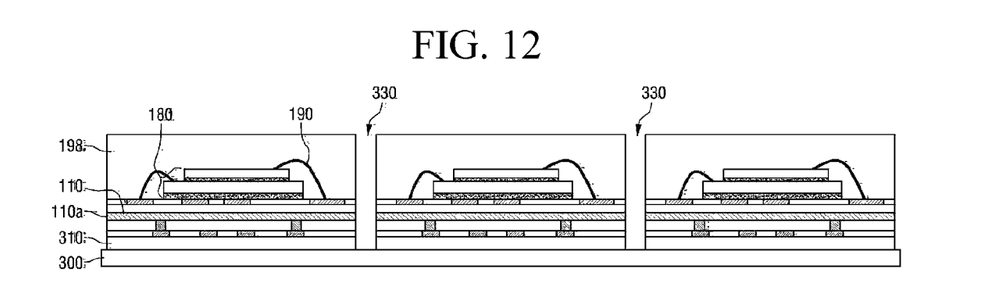

Referring to FIG. 12, a portion of the molding member 198, a portion of the substrate 100, and a portion of the adhesive layer 310 may be removed by partial dicing, so as to expose a portion of the carrier 300. A trench 330 may be formed between semiconductor device units. The units represent semiconductor devices in partial stages of processing. In one embodiment, the trench exposes lateral surfaces of the substrate 100, and the first metal layer 110 included in the substrate 100 is exposed at lateral surfaces of the substrate 100. In one embodiment, the molding member 198 and the substrate 100 are simultaneously partially diced. In this embodiment, a lateral surface of the molding member 198 and a lateral surface of the substrate 100 may be coplanar. As shown in FIG. 12, a lateral surface of the adhesive layer 310 may also be coplanar with the lateral surfaces of the molding member 198 and the substrate 100.

Figure 13:
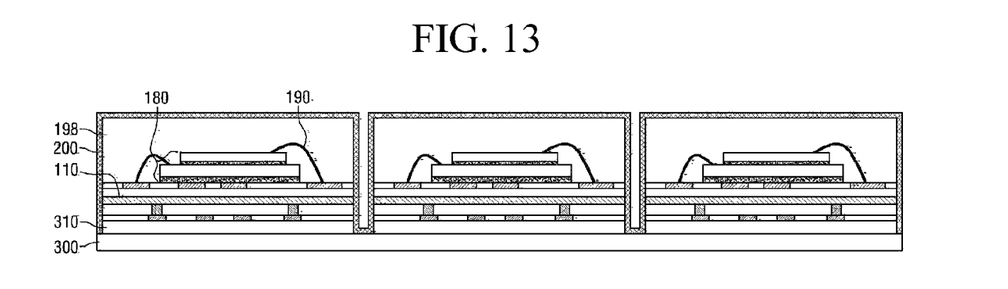

Referring to FIG. 13, a second metal layer 200 is formed along one surface (e.g., a top surface) and along lateral surfaces of the molding member 198 and the lateral surfaces of the substrate 100. In one embodiment, the second metal layer 200 may completely surround the set of semiconductor chips 180 and may extend to the lateral surfaces of the substrate 100. The shape and length of the second metal layer 200 is not limited to the examples described herein. The second metal layer 200 may be formed by plating or spraying, but the method of forming the second metal layer 200 is not limited to the examples described herein. In one embodiment, the second metal layer 200 comes into contact with the first metal layer 110 exposed at the lateral surfaces of the substrate 100.

Figure 14:
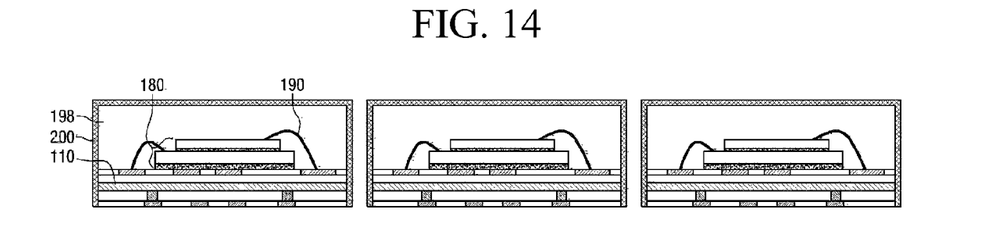

Referring to FIG. 14, the units are separated from the carrier 300. In one embodiment, in order to separate the respective units from the carrier 300, the lateral surfaces of each unit are cut using blades. Alternatively, units may be separated from the carrier 300 using blades having the same interval as a distance between the respective units.

In one embodiment, an adhesive having a characteristic of decreasing adhesiveness if heated at a predetermined temperature or exposed to an UV light may be used as an adhesive 310 for adhering each unit to the carrier. In this embodiment, heat may be applied to reach a predetermined temperature or UV light may be applied to separate the respective units from the carrier 300. The portion of the second metal layer 200 that was in contact with the adhesive 310 may be cut using a blade or removed by other known methods.

In another embodiment, the carrier 300, the adhesive 310, and a portion of the second metal layer 200 that contacts the adhesive 310 may be removed by planarization.

Semiconductor systems according to several embodiments will be described with reference to FIGS. 15 to 18.

Figure 15:
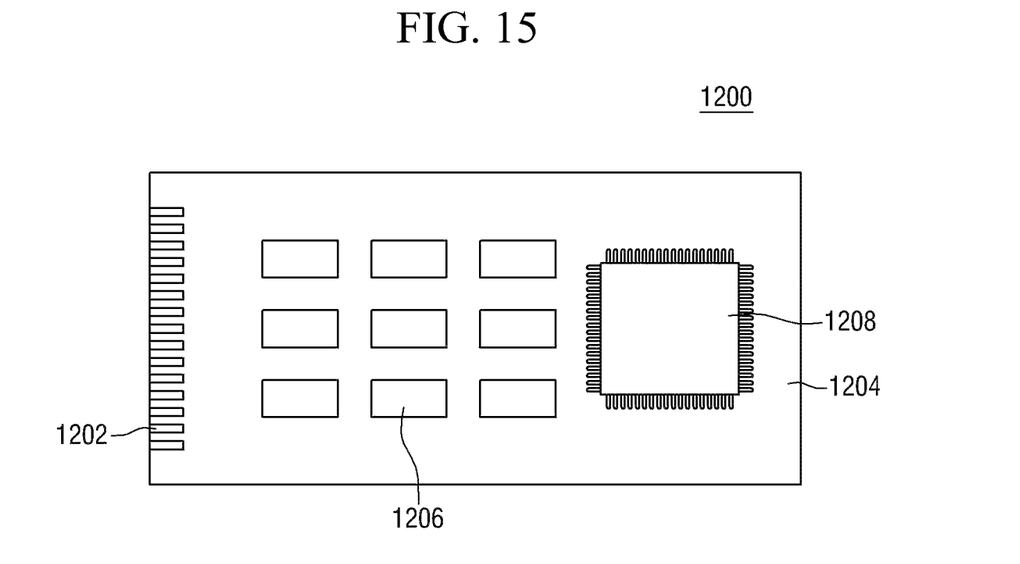
FIG. 15 is a plan view of a semiconductor system according to one embodiment.

FIG. 15 is a plan view of a semiconductor system according to one embodiment.

Referring to FIG. 15, the semiconductor system 1200 according to one embodiment may be a package module. The semiconductor system 1200 may include a module substrate 1204 provided with an external connection terminal 1202, and semiconductor devices 1206 and 1208. A packaging technique of the semiconductor device 1208 may include, for example, QFP (Quad Flat Package), but the packaging techniques of the semiconductor device 1208 are not limited to the examples described herein. In one embodiment, one or more of the semiconductor devices 1206 and 1208 may be at least one of the semiconductor devices shown in FIGS. 1 to 10. For example, one or both of the semiconductor devices 1206 and 1208 may include a substrate including a first metal layer having an exposed surface exposed at a lateral surface of the substrate, a semiconductor chip formed on one surface of the substrate, and a second metal layer formed on at least portions of lateral surfaces of the substrate while contacting the first metal layer.

Figure 16:
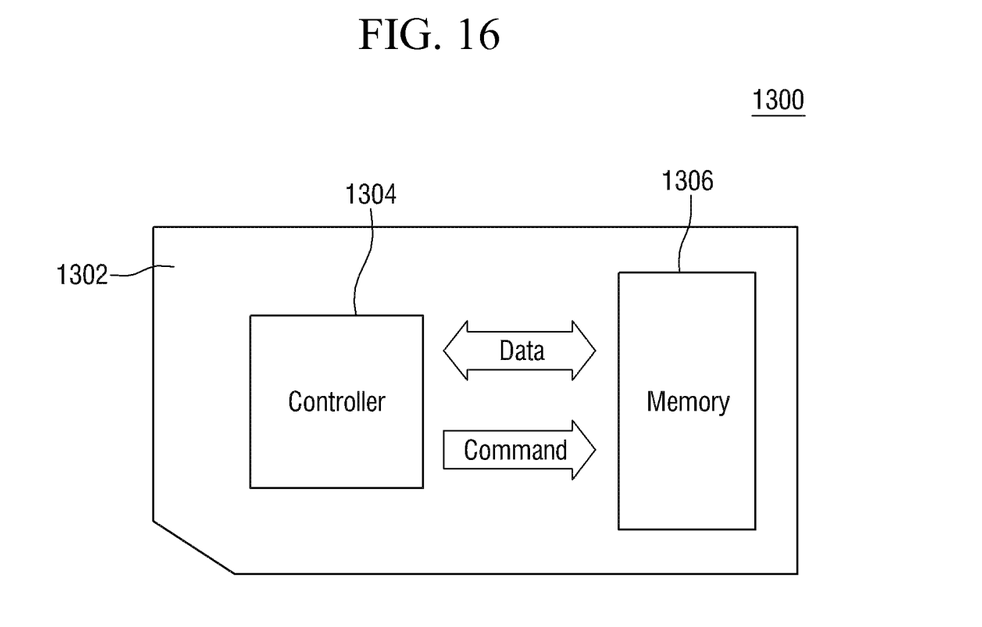
FIG. 16 is a block view of a semiconductor system according to one embodiment.

FIG. 16 is a block view of a semiconductor system according to one embodiment.

Referring to FIG. 16, the semiconductor system 1300 according to one embodiment may be a memory card. The semiconductor system 1300 may include a controller 1304 and a memory 1306 provided in a housing 1302. The controller 1304 and the memory 1306 may exchange electric signals. For example, the controller 1304 and the memory 1306 may exchange data in response to a command of the controller 1304. In one embodiment, the semiconductor system 1300 may store data in the memory 1306 or may output the data stored in the memory 1306 to the outside. One or both of the controller 1304 and the memory 1306 may be at least one of the semiconductor devices shown in FIGS. 1 to 10. The semiconductor system 1300 may be used as data storage media for various types of portable devices. For example, the semiconductor system 1300 may include a multimedia card (MMC) or a secure digital (SD) card.

Figure 17:
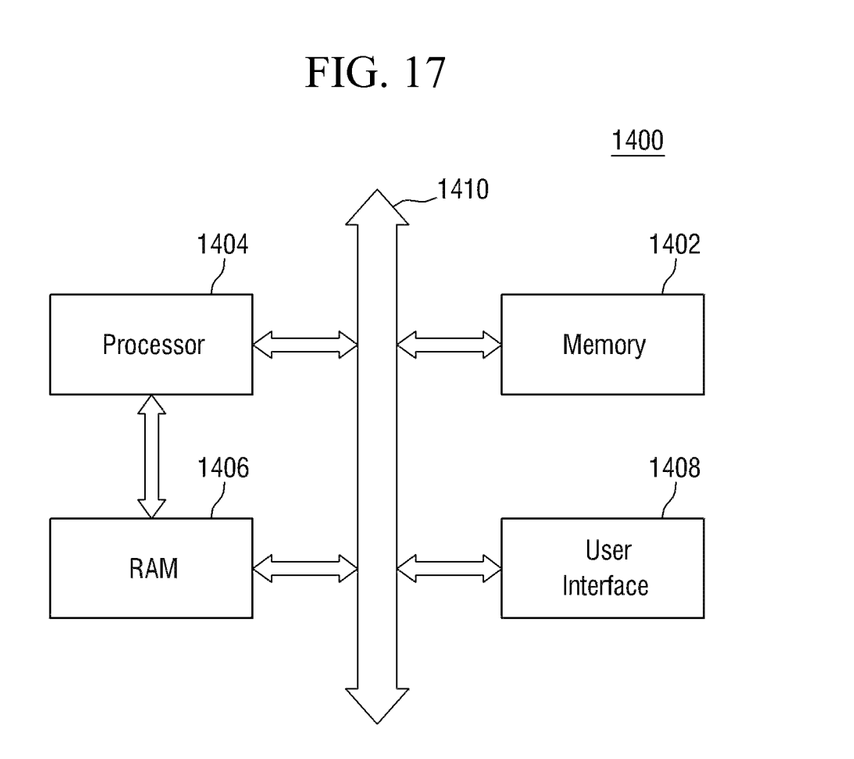
FIG. 17 is a block view of a semiconductor system according to one embodiment.
Figure 18:
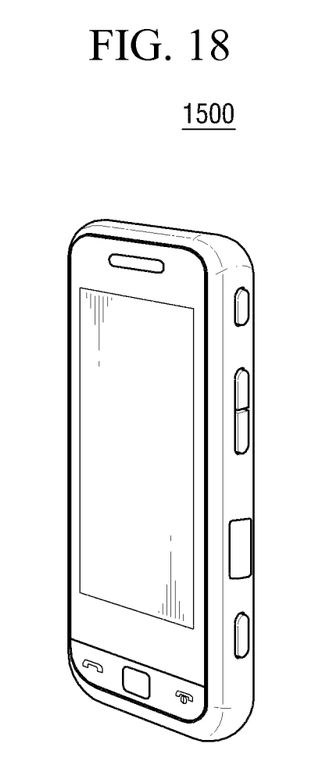
FIG. 18 illustrates an example of an electronic device including the semiconductor system shown in FIG. 17.

FIG. 17 is a block view of a semiconductor system according to one embodiment, and FIG. 18 illustrates an example of an electronic device including the semiconductor system shown in FIG. 17.

Referring to FIG. 17, the semiconductor system 1400 according to another embodiment may include a memory system 1402, a processor 1404, a random access memory (RAM) 1406, and a user interface 1408, all of which perform data communication using a bus 1410. The processor 1404 may execute a program and may control the semiconductor system 1400. The RAM 1406 may be used as an operation memory of the processor 1404. The processor 1404 and the RAM 1406 may be incorporated into one package. For example, a logic chip incorporating the processor 1404 and a memory chip incorporating the RAM 1406 may perform wireless communication. The user interface 1408 may be used to input and/or output data into and/or from the semiconductor system 1400. The memory system 1402 may store codes for operating the processor 1404, for data processed by the processor 1404, and/or for external input data. The memory system 1402 may include a controller and a memory and may be substantially the same or similar to the memory card 1300 shown in FIG. 16.

In one embodiment, the processor 1404, RAM 1406 and/or memory may include at least one of the semiconductor devices shown in FIGS. 1 to 10. For example, the processor, RAM, and/or memory may include semiconductor devices with a substrate including a first metal layer having an exposed surface exposed at a lateral surface of the substrate, a semiconductor chip formed on one surface of the substrate, and a second metal layer formed on at least portions of lateral surfaces of the substrate while contacting the first metal layer.

In one embodiment, the semiconductor system 1400 according to certain embodiments may be applied to electronic controllers for various types of electronic devices. For example, the semiconductor system 1400 may be applied to a cellular phone (e.g. system 1500 of FIG. 18). In other embodiments, the semiconductor system 1400 may be applied to portable game consoles, portable notebook computers, MP3 players, a navigation system, a solid state disk (SSD), automobiles and/or household appliances.

The above-disclosed subject matter is considered illustrative and not restrictive, and the appended claims are intended to cover all such modifications, enhancements, and other embodiments, which fall within the true spirit and scope of the disclosed embodiments. Thus, the invention is to be determined by the broadest permissible interpretation of the following claims and their equivalents, and shall not be restricted or limited by the foregoing detailed description.

What is claimed is:
1. A semiconductor device comprising:
a substrate including a ground layer formed therein, the ground layer having at least a first surface with at least a first exposed portion of the first surface exposed at a lateral surface of the substrate;
a plurality of first interconnections formed above the ground layer and spaced apart from the ground layer;
a plurality of second interconnections formed below the ground layer and spaced apart from the ground layer;
a plurality of conductive vias connecting respective first interconnections with respective second interconnections;
at least a first semiconductor chip formed on a top surface of the substrate;
a wire bonding connecting the first interconnections an the first semiconductor chip:
a molding member disposed on the top surface of the substrate and configured to mold the semiconductor chip; and
a shielding layer surrounding the molding member and extending to lateral surfaces of the substrate, at least a portion of the shielding layer contacting the exposed portion of the ground layer,
wherein the ground layer has a plate-like shape extending laterally through the entire subtrate,
werein at least a portion of the ground layer extends beneath an entire length of the semiconductor chip, and
werein the ground layer includes a plurality of holes through which the plurality of conductive vias pass, and each conductive via is insulated from the ground layer by an instilation layer.

2. The semiconductor device of claim 1, wherein the ground layer and the shielding layer are connected such as to surround the top, bottom and lateral surfaces of the first semiconductor chip.

3. The semiconductor device of claim 1, wherein the plurality of first interconnections and the plurality of second interconnections are not exposed at lateral surfaces of the substrate.

4. The semiconductor device of claim 1, wherein a lateral surface of the molding member and a lateral surface of the substrate are coplanar.

5. A semiconductor device comprising:
    a substrate including a first metal layer formed therein, the first metal layer having at least a first surface with at least a first exposed portion of the first surface exposed at a lateral surface of the substrate;
    plurality of first interconnections formed above the first metal layer and spaced apart from the first metal layer;
    a plurality of second interconnections formed below the first metal layer and spaced apart from the first metal layer;
    a plurality of conductive vias connecting respective interconnections with respective second interconnections;
    at least a first semiconductor chip formed on a top surface of the substrate;
    a wire bonding connecting the first interconnecttions and the first semiconductor chip; and
    a second metal layer formed on at least a portion of the lateral surface of the substrate, at least a portion of the second metal layer contacting the first exposed portion of the first metal layer,
    wherein the first metal layer has plate-like shape extending laterally through the entire subtrate,
    wherein at least a portion of the first metal layer extends beneath an entire length of the first semiconductor chip, and
    werein the first metal layer includes a plurality of holes through which the plurality of conductive vias pass, and conductive via is insulated from the first metal layer by an insulation layer.

6. The semiconductor device of claim 5, wherein at least a portion of the second metal layer surrounds at least a portion of the first semiconductor chip.

7. The semiconductor device of claim 6, wherein at least a portion of the second metal layer surrounds the first semiconductor chip and extends to lateral surfaces of the substrate.

8. The semiconductor device of claim 5, further comprising an external connection terminal formed on a second surface of the substrate opposite the first surface, wherein the external connection terminal is electrically connected to the first metal layer.

9. The semiconductor device of claim 8, wherein the external connection terminal is configured to receive a voltage signal.

10. The semiconductor device of claim 5, wherein the first metal layer and the second metal layer are connected such as to surround the top, bottom and lateral surfaces of the first semiconductor chip.

11. The semiconductor device of claim 5, wherein
    the first metal layer includes a plurality of stacked sub-metal layers spaced apart from each other, the plurality of sub-metal layers including respective sub-exposed surfaces, at least a portion of each sub-exposed surface being exposed at lateral surfaces of the substrate, and
    at least a portion of the second metal layer contacts at least one of the exposed portions of the plurality of sub-exposed surfaces.

12. The semiconductor device of claim 5, wherein the first exposed portion of the first surface of the first metal layer includes a plurality of protrusions.

13. A semiconductor device, comprising:
    a package substrate;
    a first semiconductor chip formed on a top surface of the package substrate; and
    an electromagnetic interference (EMI) shield, the EMI shield having a bottom layer formed in the package substrate and lateral and top layers extending to surround the lateral and top surfaces of the first semiconductor chip, wherein at least a first portion of the bottom layer is exposed at a lateral surface of the package substrate, and the first exposed portion of the bottom layer of the EMI shield is connected to the lateral layers of the EMI shield,
    the package substrate further including a plurality of first interconnections formed on a top surface of the bottom layer and spaced apart from the EMI shield, a plurality; of second interconnections, formed on a bottom surface of the bottom layer and spaced apart from the EMI shield, a plurality of conductive vias connecting respective first interconnections with respective second interconnections, and a wire bonding connecting the first interconnections and the first semiconductor chip,
    wherein the first interconnection and the second interconnection are not exposed at a lateral surface of the package substrate,
    wherein at least a second portion of the botton layer extends beneath an entire length of ih first semiconductor chip, and
    wherein the bottom layer includes a plurality of holes through which the plurality of conductive vias pass,and each conductive via is insulated from the bottom layer by an insulation layer.

14. The semiconductor device of claim 13, wherein the bottom layer of the EMI shield includes at least a first protrusion, and at least a portion of the lateral layers of the EMI shield contact the first protrusion of the bottom layer.

15. The semiconductor device of claim 13, further comprising
    an external connection terminal formed on a bottom surface of the package substrate, wherein the external connection terminal is electrically connected to the bottom layer of the EMI shield and the external connection terminal is configured to receive a ground voltage.

* * * * *